(12) United States Patent
Park

(10) Patent No.: US 8,031,525 B2
(45) Date of Patent: Oct. 4, 2011

(54) FLASH MEMORY DEVICE AND PROGRAM METHOD THEREOF

(75) Inventor: Jin-Sung Park, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 293 days.

(21) Appl. No.: 12/100,490

(22) Filed: Apr. 10, 2008

(65) Prior Publication Data

US 2009/0225600 A1  Sep. 10, 2009

(30) Foreign Application Priority Data

Apr. 23, 2007  (KR) .................. 10-2007-0039417

(51) Int. Cl.
 *G11C 16/06* (2006.01)
(52) U.S. Cl. ......... 365/185.11; 365/185.13; 365/185.22; 365/185.23
(58) Field of Classification Search ............. 365/185.11, 365/185.13, 185.22, 185.23
 See application file for complete search history.

(56) References Cited

U.S. PATENT DOCUMENTS

| | | | | |
|---|---|---|---|---|
| 5,172,338 A | * | 12/1992 | Mehrotra et al. | ........ 365/185.03 |
| 5,473,563 A | * | 12/1995 | Suh et al. | ................. 365/185.13 |
| 6,157,983 A | * | 12/2000 | Lee et al. | ....................... 711/103 |
| 7,280,398 B1 | * | 10/2007 | Lee | ............................ 365/185.11 |
| 2007/0076510 A1 | * | 4/2007 | Mangan et al. | ........... 365/230.03 |
| 2007/0109862 A1 | * | 5/2007 | Kim et al. | ................. 365/185.19 |
| 2009/0244983 A1 | * | 10/2009 | Park | .......................... 365/185.23 |

FOREIGN PATENT DOCUMENTS

| | | |
|---|---|---|
| KR | 1999-74594 | 10/1999 |
| KR | 1020000066730 | 11/2000 |
| KR | 1020010100783 A | 11/2001 |
| KR | 1020040090841 A | 10/2004 |
| KR | 10-0660544 | 12/2006 |

OTHER PUBLICATIONS

English Abstract for Publication No. 10-0660544.
English Abstract for Publication No. 1020000066730.

* cited by examiner

*Primary Examiner* — Amir Zarabian
*Assistant Examiner* — Jay Radke
(74) *Attorney, Agent, or Firm* — F. Chau & Associates, LLC

(57) ABSTRACT

A flash memory device that includes a voltage generator circuit configured to generate a program voltage, a pass voltage, and a high voltage; a plurality of planes configured to perform a program operation in response to the program, pass, and high voltages and to verify the program operation, respectively; and control logic configured to control the planes in response to verification results from the planes, wherein the control logic controls the planes so as to interrupt the program and pass voltages or the high voltage from being applied to program-passed planes.

15 Claims, 10 Drawing Sheets ns pages pour

FLASH MEMORY DEVICE AND PROGRAM METHOD THEREOF

CROSS-REFERENCE TO RELATED APPLICATION

This U.S. non-provisional patent application claims priority under 35 U.S.C. §119 of Korean Patent Application No. 2007-39417 filed on Apr. 23, 2007, the entire contents of which are hereby incorporated by reference.

BACKGROUND

The present disclosure relates to a flash memory device and, more particularly, to a flash memory device and a program method capable of reducing program disturbance.

A non-volatile memory device may retain stored data in memory cells even when the power is turned off. As an example of such a non-volatile memory device, a flash memory device may have a function of electrically erasing data of memory cells collectively, so that it is widely used for applications such as computers, memory cards, and the like.

A flash memory device may be classified into a NOR type and a NAND type based upon the interconnection between memory cells and bit lines. In general, the NOR-type flash memory device is unfavorable for high integration, although it has an advantage that it can easily cope with high speed. The NAND-type flash memory device is favorable for high integration, because it consumes less current than the NOR-type flash memory device.

The NAND-type flash memory device may include a memory cell array as a region for storing information. The memory cell array may consist of a plurality of blocks, each of which has a plurality of cell strings (referred to as NAND strings). The NAND-type flash memory device may farther include a page buffer circuit that is configured to store or read data in or from the memory cell array. As is known in the art, in the case of the NAND-type flash memory device, memory cells may be programmed or erased by use of the Fowler-Nordheim (FN) tunneling current. Erase and program methods of the NAND-type flash memory device are disclosed in greater detail in U.S. Pat. No. 5,473,563 entitled "Nonvolatile Semiconductor Memory" and in U.S. Pat. No. 5,696,717 entitled "Nonvolatile Integrated Circuit Memory Devices Having Adjustable Erase/Program Threshold Voltage Verification Capability", the entire contents of which are hereby incorporated by reference.

The NAND-type flash memory device may be classified into a Single Level Cell (SLC) NAND-type flash memory device and a Multi Level Cell (MLC) NAND-type flash memory device.

The SLC NAND-type flash memory device can store 1-bit data per memory cell, while the MLC NAND-type flash memory device can store multi-bit data per memory cell.

FIG. 1 is a diagram showing threshold voltage distributions of a conventional MLC NAND-type flash memory device. The distribution figure indicates the case that 2-bit data is stored in each memory cell of the MLC NAND-type flash memory device. It will be understood by one of ordinary skill in the art, however, that the MLC NAND-type flash memory device is configured, to store N-bit data (N is an integer of 3 or more) per memory cell.

Referring to FIG. 1, when erased, a memory cell may have an erase state ST0. Further, each memory cell may be programmed to have one of program states (or, data states) ST1, ST2 and ST3. Although not illustrated, in a case where 3-bit data is stored in each memory cell, each memory cell may have one of an erase state (ST0) and seven program states (ST1~ST7).

A conventional NAND-type flash memory device may include a plurality of planes, each of which has a separate memory cell array. A memory cell array may include memory cells arranged in rows and columns. During a multi-plane program operation, the NAND-type flash memory device may perform a program operation with respect to all or selected planes at the same time. In this case, the NAND-type flash memory device may perform a verification operation for confirming whether a program operation of each plane is made in the normal fashion. A program operation is passed when data is programmed normally and is failed when data is not programmed normally. As is known in the art, the NAND-type flash memory device may repeat a program operation until the program operations of all the selected planes are passed.

Although a program-passed plane exists, the NAND-type flash memory device may perform a program operation with respect to all selected planes when at least one plane is judged to be program-failed. During the repeated program operation, a program voltage and a pass voltage are applied to all selected planes that consist of program-passed planes and program-failed planes. Accordingly, if the NAND-type flash memory device has at least one program-failed plane, the program and pass voltages may be applied to all selected planes that include program-passed planes.

In this case, memory cells in a program-passed plane may be unnecessarily supplied with the program and pass voltages. That is, memory cells in a program-passed plane may be unduly stressed. Memory cells thus stressed may be soft programmed, as illustrated by the broken lines in FIG. 1. This means that threshold voltages of the memory cells in the program-passed plane are increased, which is illustrated by the broken lines in FIG. 1. In other words, the memory cells in the program-passed plane may suffer from program disturbance.

A NAND-type flash memory device may read data from selected memory cells to output the read data externally. During a read operation, read voltages R0, R1, and R2 defined between ST0 and ST1, between ST2 and ST3, and between ST2 and ST3, respectively, may be used to read 2-bit data. If threshold voltage distributions of respective states are increased over the read voltages R0, R1, and R2, it is impossible to read data from memory cells having the states ST0, ST1, ST2, and ST3 accurately. That is, a read error may arise.

As a result, during a multi-plane program operation, if at least one plane is judged to be program-failed, the program and pass voltages may be continuously applied to memory cells of the program-passed planes. This may cause a read error due to program disturbance.

SUMMARY OF THE INVENTION

Exemplary embodiments of the present invention are directed to provide a flash memory device and a program method thereof capable of reducing program disturbance.

One exemplary embodiment of the present invention provides a flash memory device that comprises a voltage generator circuit configured to generate a program voltage, a pass voltage, and a high voltage; a plurality of planes configured to perform a program operation in response to the program, pass, and high voltages and to verify the program operation, respectively; and control logic configured to control the planes in response to verification results from the planes, wherein the control logic controls the planes so as to interrupt the program and pass voltages or the high voltage to be applied to program-passed planes.

An exemplary embodiment of the present invention provides a program method for a flash memory device that includes a plurality of planes having a memory cell array formed of memory cells arranged in rows and columns. The program method comprises performing a multi-plane program operation; verifying whether a program operation of the respective planes is program passed or program failed; determining whether to interrupt a program voltage, a pass voltage, and a high voltage in the respective planes based on the verification result, wherein when a plane is judged to be program passed, the program and pass voltages or the high voltage is prevented from being applied to the program-passed plane.

BRIEF DESCRIPTION OF THE FIGURES

Exemplary embodiments of the present invention will be understood in more detail from the following descriptions taken in conjunction with the following figures, wherein like reference numerals refer to like parts throughout the various figures unless otherwise specified. In the figures.

DETAILED DESCRIPTION OF EXEMPLARY EMBODIMENTS

Figure 1:
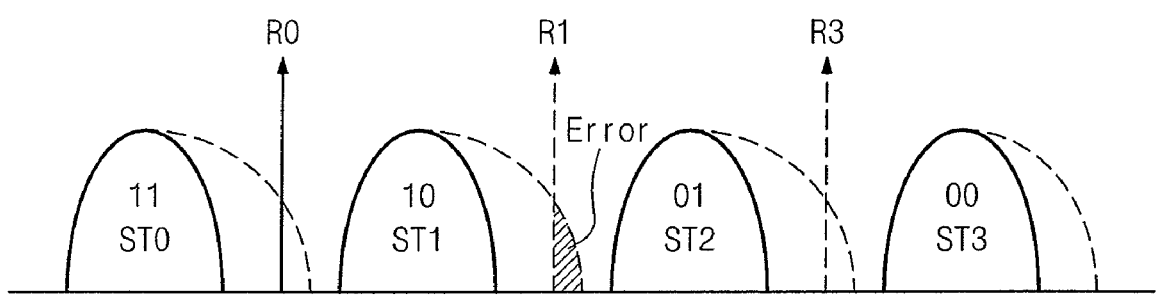
FIG. 1 is a diagram showing threshold voltage distributions of a conventional MLC NAND-type flash memory device.

Exemplary embodiments of the present invention will be described below in more detail with reference to the accompanying drawings, showing a flash memory device as an example for illustrating structural and operational features provided by the present invention. The present invention may, however, be embodied in different forms and should not be constructed as limited to the exemplary embodiments set forth herein. Rather, these exemplary embodiments are provided so that this disclosure will be thorough and complete, and will fully convey the scope of the present invention to those of ordinary skill in the art. Like reference numerals refer to like elements throughout the accompanying figures.

As will be described below, a flash memory device according to an exemplary embodiment of the present invention may include a voltage generator circuit configured to generate a program voltage, a pass voltage, and a high voltage; a plurality of planes configured to perform a program operation in response to the program, pass, and high voltages and to verify whether a program operation has passed or failed; and control logic configured to control the planes in response to verification results of the planes. More specifically, the control logic may control the planes so as to prevent the program and pass voltages or the high voltage from being supplied to program-passed planes. Accordingly, the flash memory device of an exemplary embodiment of the present invention is capable of reducing the stress to program-passed planes, that is, reducing a program disturbance.

Figure 2:
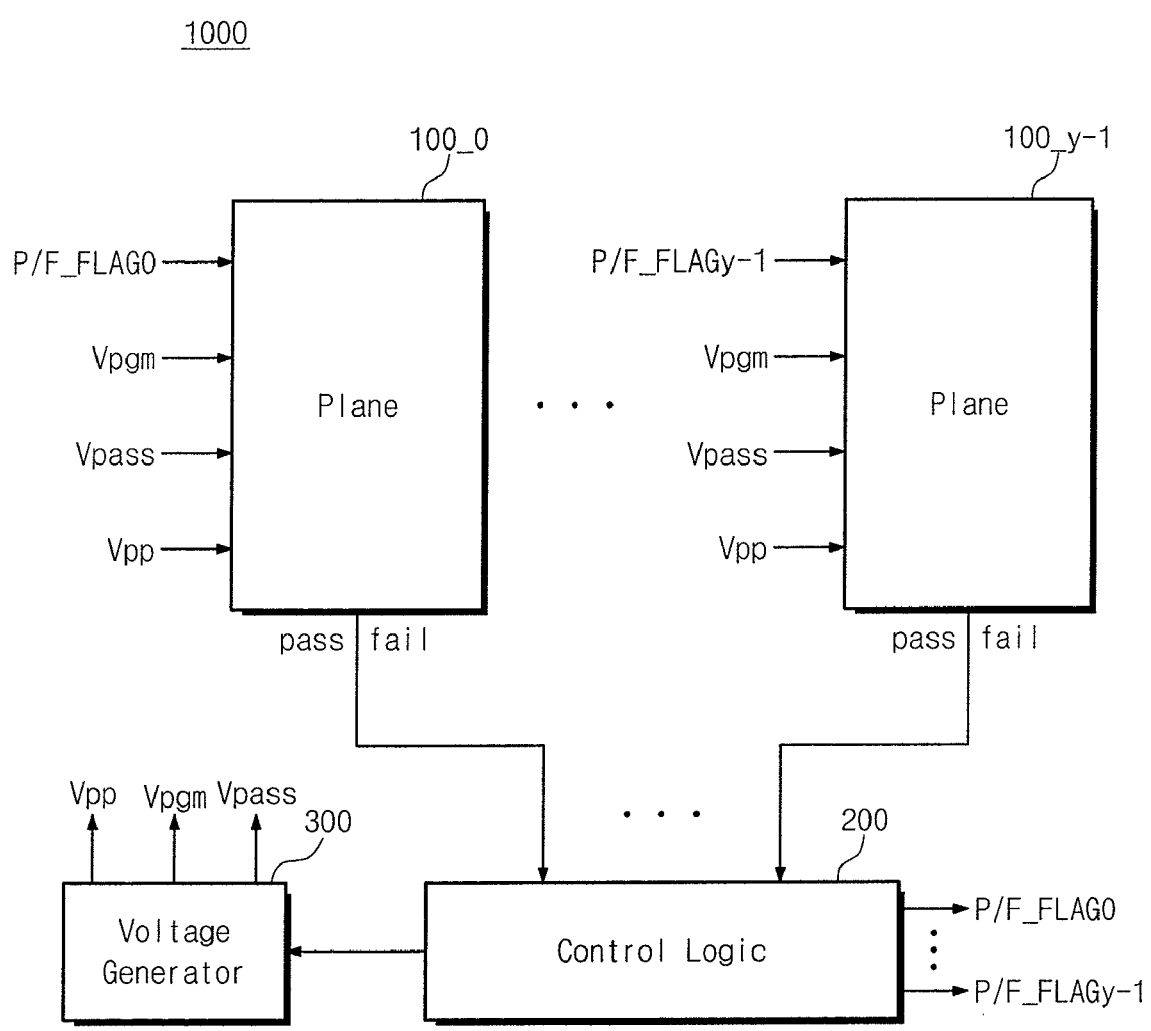
FIG. 2 is a block diagram showing a flash memory device according to an exemplary embodiment of the present invention.

FIG. 2 is a block diagram showing a flash memory device according to an exemplary embodiment of the present invention.

Referring to FIG. 2, a flash memory device 1000 according to an exemplary embodiment of the present invention may include a plurality of planes 100_1 to 100_$y$-1, a control logic unit 200, and a voltage generator circuit 300. The flash memory device 1000 according to this exemplary embodiment of the present invention may be an SLC NAND-type flash memory device or an MLC NAND-type flash memory device.

Each of the planes 100_0 to 100_$y$-1 may be configured to store data information at a multi-plane program operation and to verify whether the data information is stored normally. Verification results of the planes 100_0~100_$y$-1 may be transferred to the control logic 200.

The control logic 200 may be configured to generate control signals P/F_FLAG0~P/F_FLAGy-1 each corresponding respectively to the planes 100_0~100_$y$-1 in response to the verification results from the planes 100_0~100_$y$-1. Further, the control logic 200 may be configured to control an entire operation of the flash memory device 1000.

The voltage generator circuit 300 may be configured to generate a program voltage Vpgm, a pass voltage Vpass, and a high voltage Vpp under the control of the control logic 200. The respective program, pass, and high voltages Vpgm, Vpass and Vpp may be supplied to the respective planes 100_0~100_$y$-1.

In a case where a multi-plane program operation is carried out, the flash memory device 1000 may perform a program operation in which the data information is stored in all or selected ones of the planes. The program operation may be repeated until the data information is stored normally in all or selected ones of the planes. When a program operation of a plane is passed, the plane may output a pass signal. On the other hand, when a program operation of a plane is failed, the plane may output a fail signal. Hereinafter, such a plane that a program operation is passed is referred to as a 'program-passed plane', and such a plane that a program operation is failed is referred to as a 'program-failed plane'.

For example, assuming that a plane 100_0 is program-passed and a plane 100_$y$-1 is program-failed, the plane 100_0 outputs a pass signal and the plane 100_$y$-1 outputs a fail signal. The pass and fail signals are supplied to the control logic 200 as verification results. The control logic 200 may activate a control signal P/F_FLAG0 in response to the pass signal from the plane 100_0, and may inactivate a control signal P/F_FLAGy-1 in response to the fail signal from the plane 100_$y$-1. The control signals P/F_FLAG0 and P/F_FLAGy-1 may be fed to the planes 100_0 and 100_$y$-1, respectively.

The program-passed plane 100_0 may be configured to prevent the program and pass voltages Vpgm and Vpass from being received in response to the activated control signal P/F_FLAG0. Accordingly, no program operation may be made with respect to the program-passed plane 100_0 that receives the activated control signal P//F_FLAG0. On the other hand, the program-failed plane 100_y-1 may receive the program voltage Vpgm and pass voltage Vpass from the voltage generator 300 in response to the inactivated control signal P/F_FLAGy-1. This means that a program operation is repeatedly made with respect to the program-failed plane 100_y-1 that receives the inactivated control signal P/F_FLAGy-1.

As a result, the flash memory device 1000 may be configured to prevent a program operation from being performed with respect to program-passed planes, even though certain planes are not program-passed.

Figure 3:
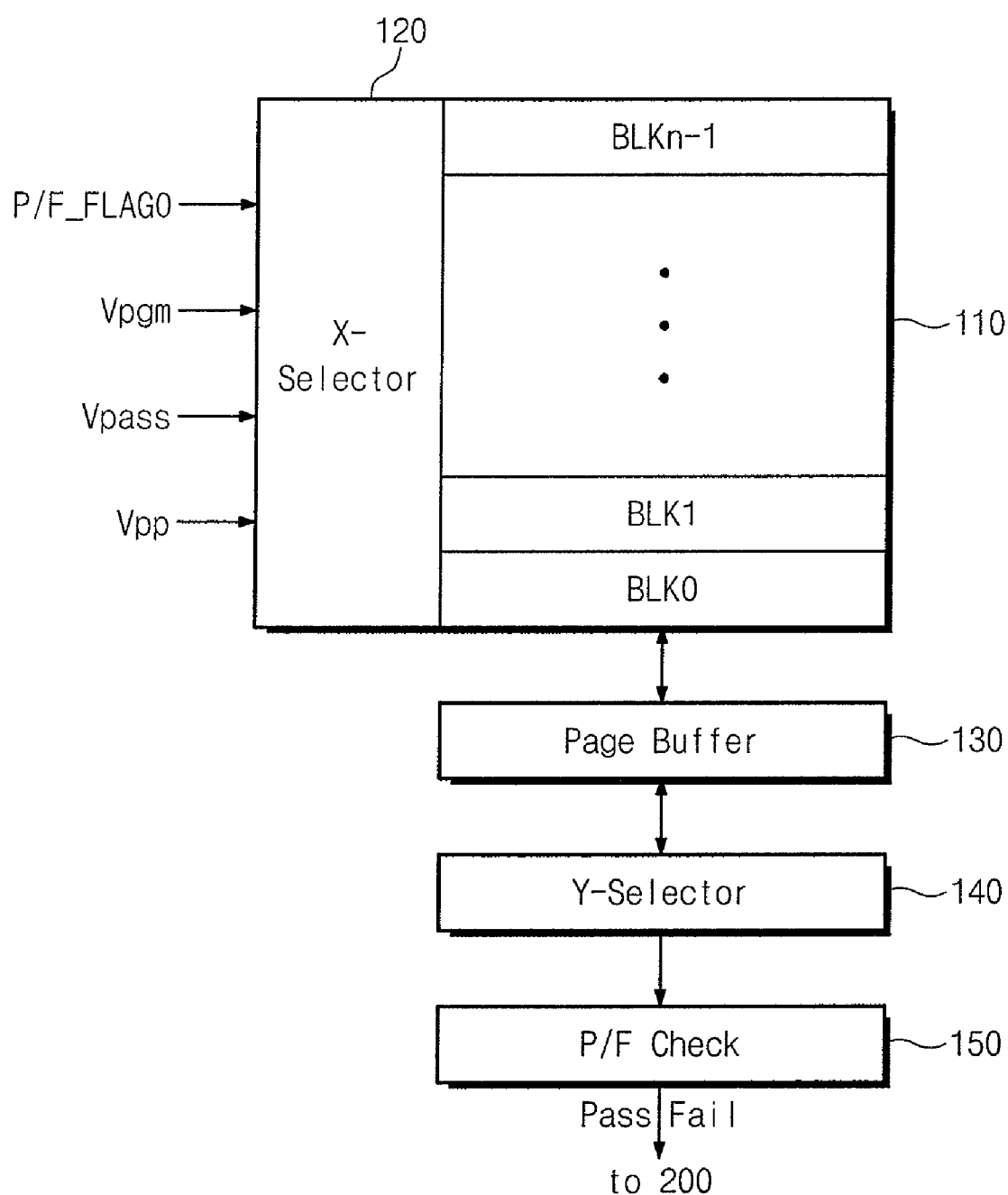
FIG. 3 is a block diagram showing a plane illustrated in FIG. 2.

FIG. 3 is a block diagram showing a plane illustrated in FIG. 2. Respective planes 100_0~100_j-1 may be configured to have the same structure as that illustrated in FIG. 3.

Referring to FIG. 3, the plane 100_0 according to an exemplary embodiment of the present invention may include a memory cell array 110 having a plurality of memory blocks BLK0~BLKn-1, a row selector circuit 120, a page buffer circuit 130, a column selector circuit 140, and a pass/fail check circuit 150. Each of the memory blocks BLK0~BLKn-1 may include a plurality of memory cells arranged in rows (or word lines) and columns (or bit lines). The memory cell array 110 may store data information.

The row selector circuit 120 can select a memory block in response to an externally input block address (not shown) and select a word line in the selected memory block in response to a row address (not shown). The row selector circuit 120 may receive a program voltage Vpgm, a pass voltage Vpass, and a high voltage Vpp from the voltage generator circuit 300 shown in FIG. 2 and a control signal P/F_FLAG0 from the control logic 200 of FIG. 2. At a program operation, the row selector circuit 120 may apply the program voltage Vpgm to a selected word line and the pass voltage Vpass to respective unselected word lines. More specifically, the row selector circuit 120 may be configured to prevent the voltages Vpgm, Vpass, and Vpp from being applied to corresponding signal lines based upon activation of the control signal P/F_FLAG0.

The page buffer circuit 130 may include page buffers that are electrically connected respectively to bit lines shared by all memory blocks. Each of the page buffers may operate as a sense amplifier or a write driver based on a mode of operation.

For example, in a program operation, the page buffer circuit 130 may store data provided via the column selector circuit 140 and drive bit lines of the memory cell array 110 with a predetermined voltage, for example, a power-supply voltage, or a ground voltage, based on the stored data, respectively. In a read or verify operation, the page buffer circuit 130 may sense data bits stored in memory cells of a selected word line. In a read operation, the sensed data bits may be output externally via the column selector circuit 140. In a verify operation, the sensed data bits may be transferred to the pass/fail check circuit 150 via the column selector circuit 140.

The pass/fail check circuit 150 may check whether all data bits transferred via the column selector circuit 140 have a pass data value and provide a pass or fail signal to the control logic 200 of FIG. 2 as a verification result.

The control logic 200 may generate the control signal P/F_FLAG0 in response to the verification result from the pass/fail check circuit 150 to output the control signal P/F_FLAG0 to the row selector circuit 120.

During a multi-plane program operation, all or selected ones of the planes may perform a program operation separately. More specifically, during a verification interval, the pass/fail check circuit 150 of each plane may check whether the memory cells are normally programmed. If a plane, for example, 100_0, is judged to be program-passed, a program operation may be made as follows.

The pass/fail check circuit 150 of the program-passed plane provides a pass signal to the control logic 200 as a verification result. The control logic 200 activates the control signal P/F_FLAG0 in response to the pass signal from the pass/fail check circuit 150. The row selector circuit 120 of the program-passed plane interrupts the program and pass voltages Vpgm and Vpass or the high voltage Vpp supplied from the voltage generator circuit 300 in response to the activated control signal P/F_FLAG0. Accordingly, it is possible to prevent memory cells of a selected memory block in the program-passed plane 100_0 from being subjected to undue stress.

If a plane, for example, 100_0, is judged to be program-failed, a program operation may be performed as follows.

The pass/fail check circuit 150 of the program-failed plane may provide a fail signal to the control logic 120 as a verification result. The control logic 200 may inactivate the control signal P/F_FLAG0 in response to the fail signal from the pass/fail check circuit 150. The row selector circuit 120 may receive the voltages Vpgm, Vpass, and Vpp in response to the inactivated control signal P/F_FLAG0, so that a program operation is again performed with respect to the program-failed plane.

Figure 4:
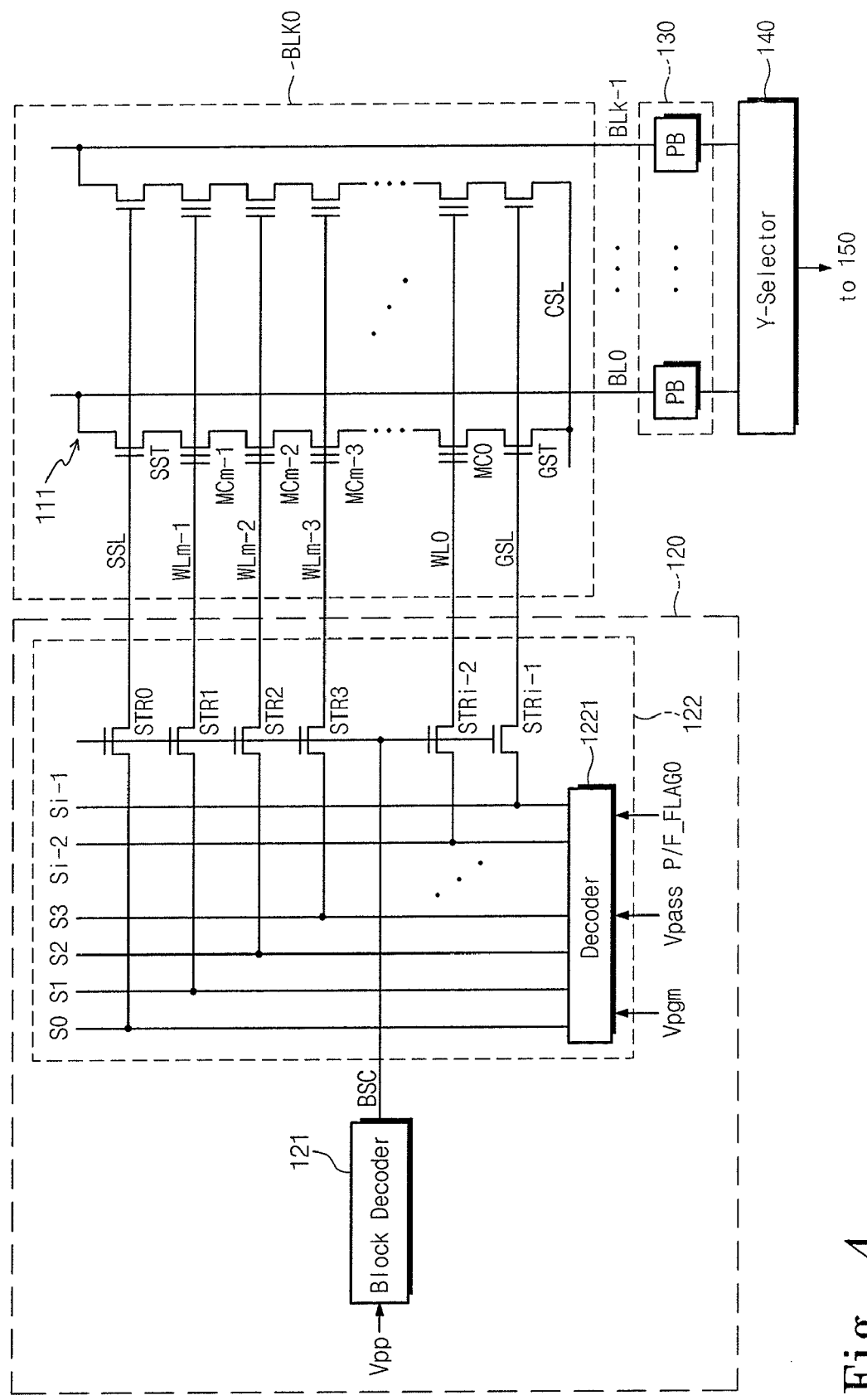
FIG. 4 is a block diagram showing a row selector circuit illustrated in FIG. 3 according to an exemplary embodiment of the present invention.

FIG. 4 is a block diagram showing a row selector circuit illustrated in FIG. 3 according to an exemplary embodiment of the present invention.

Referring to FIG. 4, a memory block BLK0 may include a plurality of transistor strings 111, each of which has a string select transistor SST, a ground select transistor GST, and a plurality of memory cell transistors MC0~MCm-1 connected in series between the select transistors SST and GST. The strings 111 are electrically connected to corresponding bit lines BL0~BLk-1, respectively. Although not illustrated in the figures, the bit lines BL0~BLk-1 may be arranged so as to be shared by all memory blocks BLK0~BLKn-1 of the plane 100_0. In each string 111, the string select transistor SST is connected to a string select line SSL, the ground select transistor GST is connected to a ground select line GSL, and the memory cell transistors MC0~MCm-1 are respectively connected to corresponding word lines WL0~WLm-1.

The row selector circuit 120 may include a block decoder 121 and a row decoder 122. The row decoder 122 may include select transistors STR0~STRi-1. The lines SSL, WL0~WLm-1, and GSL are respectively connected to corresponding select lines S0~Si-1 through the select transistors STR0~STRi-1.

The row decoder 122 may further comprise a decoder 1221 that is configured to transfer corresponding voltages, supplied from the voltage generator circuit shown in FIG. 2, to the select lines S0~Si-1 in response to row address information and the control signal P/F_FLAG0. The decoder 1221 operates as a word line driver circuit. The decoder 1221 interrupts the program and pass voltages Vpgm and Vpass supplied from the voltage generator circuit 300 shown in FIG. 2 in response to an activated control signal P/F_FLAG0. At this time, the decoder 1221 drives the select lines S1~Si-2 with either a predetermined voltage or a ground voltage and drives the select lines S0 and Si-1 with a power-supply voltage and a ground voltage, so that the word lines WL0~WLm-1 are driven with a ground voltage or the predetermined voltage. In this exemplary embodiment, the predetermined voltage may be a voltage identical to or lower than a power supply voltage.

Gates of the select transistors STR0~STRi-1 are commonly connected to a block select line BSC, which is output from the block decoder 121. The block decoder 121 may select a memory block in response to externally input block address information. That is, the block decoder 121 may activate or inactivate the block select line BSC in response to the block address information. The page buffer circuit 130 may include page buffers PB connected to the bit lines BL0~BLk-1, respectively. In a program verify operation, each of the page buffers PB may output read data to the pass/fail check circuit 150 via the column selector circuit 140. Data transferred to the pass/fail check circuit 150 may be used to check whether a program operation of selected memory cells is normally performed. Exemplary page buffer and pass/fail check circuits are disclosed in U.S. Pat. No. 5,299,162 entitled 'Nonvolatile Semiconductor Memory Device And An Optimizing Programming Method Thereof', the entire contents of which are hereby incorporated by reference.

Figure 5:
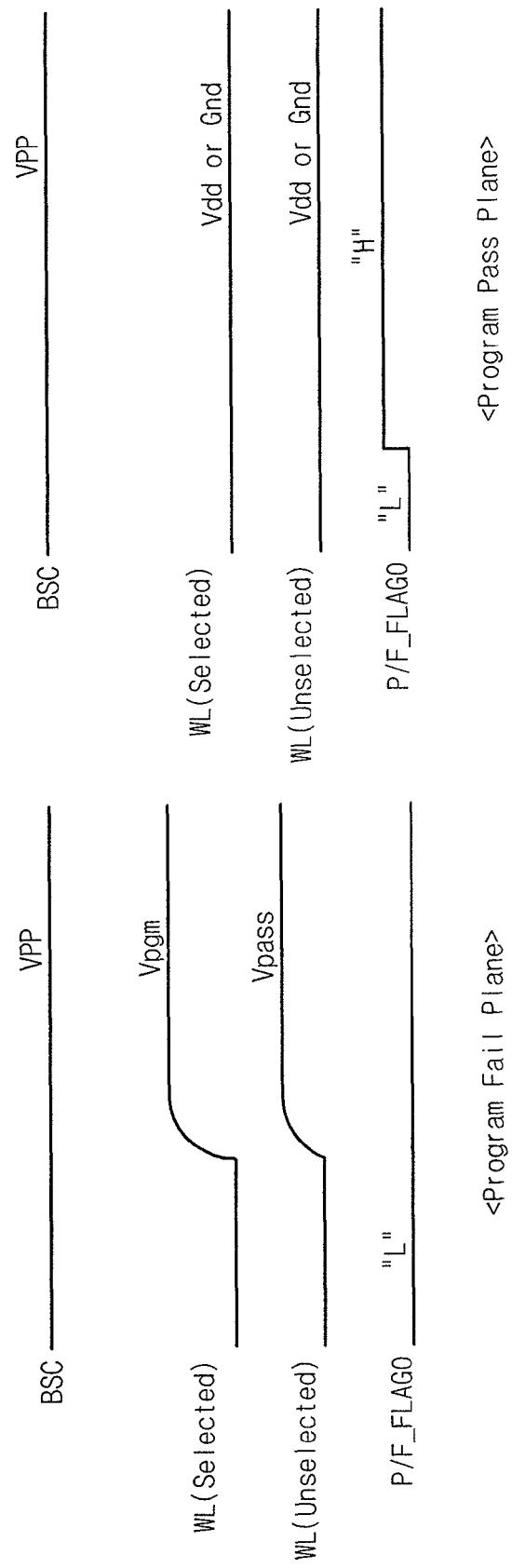
FIG. 5 is a timing diagram for describing a multi-plane program operation of a flash memory device including a row selector circuit illustrated in FIG. 4.

FIG. 5 is a timing diagram for describing a multi-plane program operation of a flash memory device including a row selector circuit illustrated in FIG. 4. Below, a multi-plane program operation of the flash memory device according to an exemplary embodiment of the present invention will be more fully described with reference to FIGS. 4 and 5. For convenience of description, a multi-plane program operation will be described using plane, 100_0, however, it will be seen by one of ordinary skill in the art that the present invention can be applied to other planes.

Figure 6:
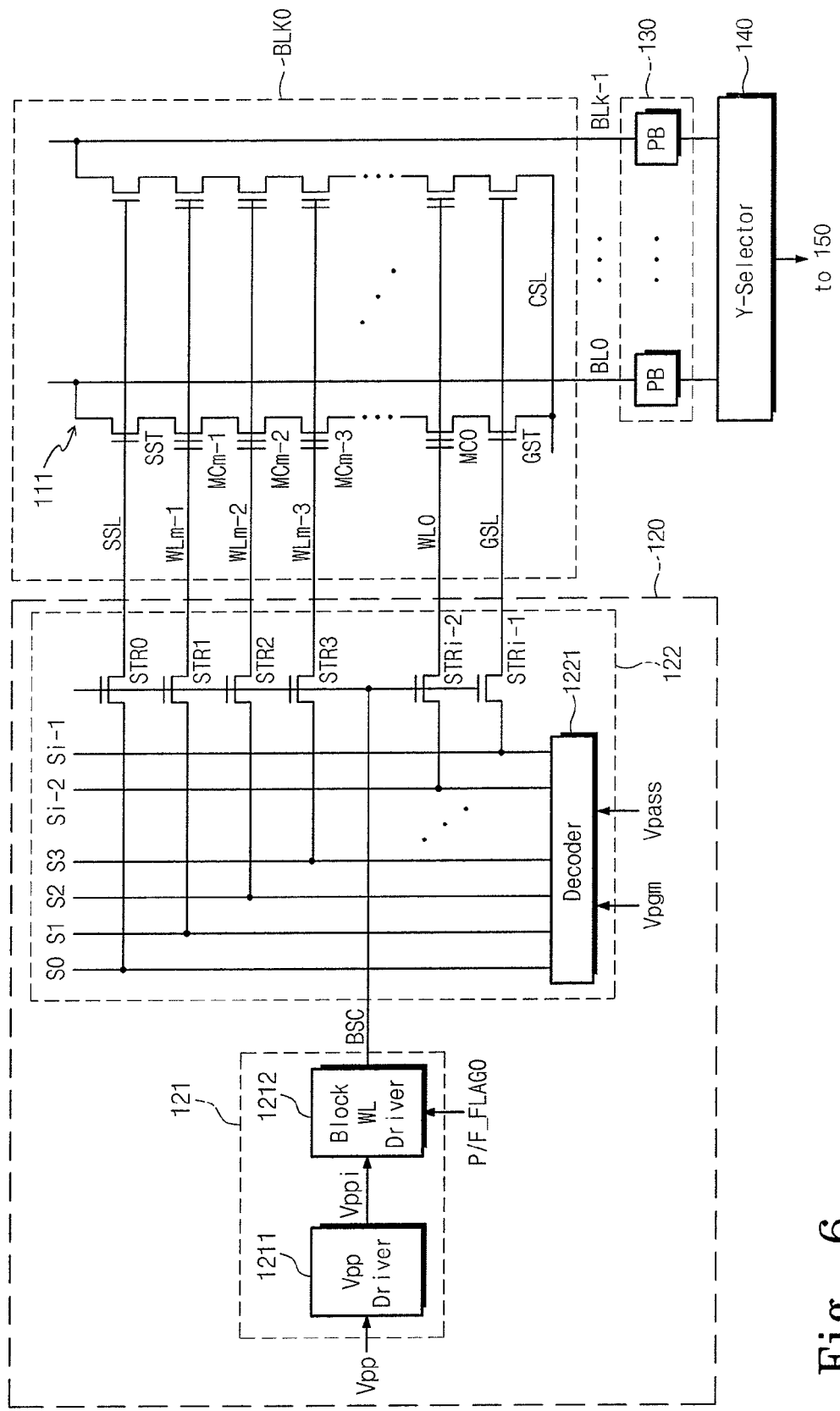
FIG. 6 is a block diagram showing a row selector circuit illustrated in FIG. 3 according to an exemplary embodiment of the present invention.

Once a multi-plane program operation commences, the block decoder 121 of FIG. 2 may drive a block select line BSC with a high voltage Vpp from a voltage generator circuit 300 shown in FIG. 2, so that select transistors STR0~STRi-1 shown in FIG. 4 are turned on. More specifically, the block decoder 121 may include a high-voltage driver 1211 and a block word line driver 1212, which are illustrated in FIG. 6. The high-voltage driver 1211 may provide the high voltage Vpp from the voltage generator circuit 300 to the block word line driver 1212 as a block word line voltage Vppi. The block word line driver 1212 of the block decoder 121 may drive the block select line BSC with the block word line voltage Vppi being the high voltage Vpp.

In the case where the plane 100_0 is judged to be program-passed after a program verify operation, control logic 200 of FIG. 2 may activate a control signal P/F_FLAG0 to go high in response to a verification result of the pass/fail check circuit 150. The decoder 1221 in the row decoder 122 may prevent the program and pass voltages Vpgm and Vpass from being transferred to select lines S1~Si-2 in response to the activated control signal P/F_FLAG0. At the same time, the decoder 1221 may drive the select line S1~Si-2 with a predetermined voltage or a ground voltage Gnd. Accordingly, a ground voltage or a predetermined voltage may be applied to all word lines in a selected memory block via the turned-on select transistors STR1~STRi-2. In this exemplary embodiment, the predetermined voltage may be a power-supply voltage Vdd or a voltage lower than the power-supply voltage. Because programmed memory cells in the program-passed plane are supplied with the predetermined voltage or the ground voltage during a program operation, it is possible to prevent program stress (or disturbance) of the programmed memory cells due to a program operation for program-failed planes.

In the case that the plane 100_0 is judged to be program-failed, as illustrated in FIG. 5, the control logic 200 may inactivate the control signal P/F_FLAG0 to a low level in response to a verification result of the pass/fail check circuit 150. The decoder 1221 in the row decoder 122 shown in FIG. 4 may drive select lines corresponding to the word lines WL0~WLm-1 with corresponding program and pass voltages Vpgm and Vpass, respectively, in response to the inactivated control signal P/F_FLAG0. That is, a selected word line is driven with the program voltage Vpgm and unselected word lines are driven with the pass voltage Vpass. Accordingly, a program operation may be made with respect to the program-failed plane.

FIG. 6 is a block diagram showing a row selector circuit 120 illustrated in FIG. 3 according to an exemplary embodiment of the present invention. In FIG. 6, constituent elements that are substantially identical to those in FIG. 4 are marked by the same numerals, and a description thereof is thus omitted.

Referring to FIG. 6, the block decoder 121 may include the high-voltage driver 1211 and the block word line driver 1212. The high-voltage driver 1211 transfers a high voltage Vpp from the voltage generator circuit 300 shown in FIG. 2 to the block word line driver 1212 as the block word line voltage Vppi. The block word line driver 1212 may respond to a control signal P/F_FLAG0 from control logic 200 to determine whether to apply the block word line voltage Vppi to the block word line BSC.

Figure 7:
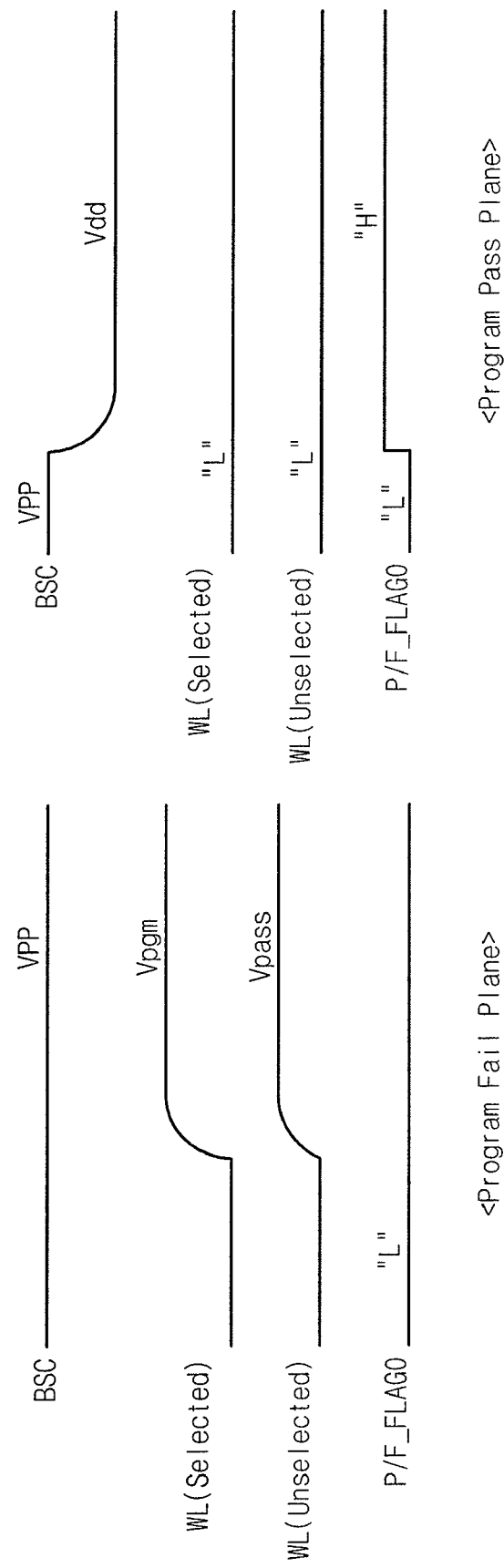
FIG. 7 is a timing diagram for describing a multi-plane program operation of a flash memory device including a row selector circuit illustrated in FIG. 6.

FIG. 7 is a timing diagram for describing a multi-plane program operation of a flash memory device including a row selector circuit 120 illustrated in FIG. 6. Hereinafter, a multi-plane program operation according to the flash memory device will be more fully described with reference to FIGS. 6 and 7.

Basically, a program operation may be performed identically to that described above. After the program operation, a verify operation may be made. A plane may be judged to be program-passed or program-failed as a verification result.

In the case that the plane is judged to be program-passed, as illustrated in FIG. 7, control logic 200 may activate a control signal P/F_FLAG0 in response to a verification result from the program-passed plane 100_0. The block word line driver 1212 may interrupt transferring the block word line voltage Vppi as the high voltage Vpp in response to the activated control signal P/F_FLAG0. At this time, the block word line driver 1212 may output a predetermined voltage, for example, identical or lower than a power-supply voltage, as the block word line voltage Vppi in response to the activated control signal P/F_FLAG0. This means that the block word line BSC is driven with the predetermined voltage via the block word line driver 1212. Alternatively, a ground voltage may be applied to the block word line BSC instead of the predetermined voltage. As a result, the select transistors STR0~STRi-1 may be slightly turned on by the block word line BSC that is driven with the predetermined voltage. This makes it possible to limit the predetermined voltage of the respective program and pass voltages Vpgm and Vpass to be applied to the word lines WL0~WLm-1.

As a result, it is possible to prevent the respective program and pass voltages Vpgm and Vpass from being applied to selected memory cells in the program-passed plane. That is, program disturbance may be reduced with respect to the program-passed plane.

In the case where the plane 100_0 is judged to be program-failed, as illustrated in FIG. 7, the control logic 200 may inactivate the control signal P/F_FLAG0 in response to a verification result from the program-failed plane. As the control signal P/F_FLAG0 is inactivated, that is, set to a low-level, the block word line BSC may be driven with the high voltage Vpp, that is, the block word line voltage Vppi. This enables the select transistors STR0~STRi-1 to be turned on so as to transfer the respective program and pass voltages Vpgm and Vpass to corresponding word lines of the program-failed plane. This means that a program operation is again made with respect to the program-failed plane.

As will be understood from the above description, the flash memory device 1000 according to an exemplary embodiment of the present invention may be configured to prevent the respective program and pass voltages Vpgm and Vpass from being applied to memory cells of a program-passed plane, with at least one plane being program-failed. Thus, the flash memory device 1000 is capable of reducing program disturbance.

Figure 8:
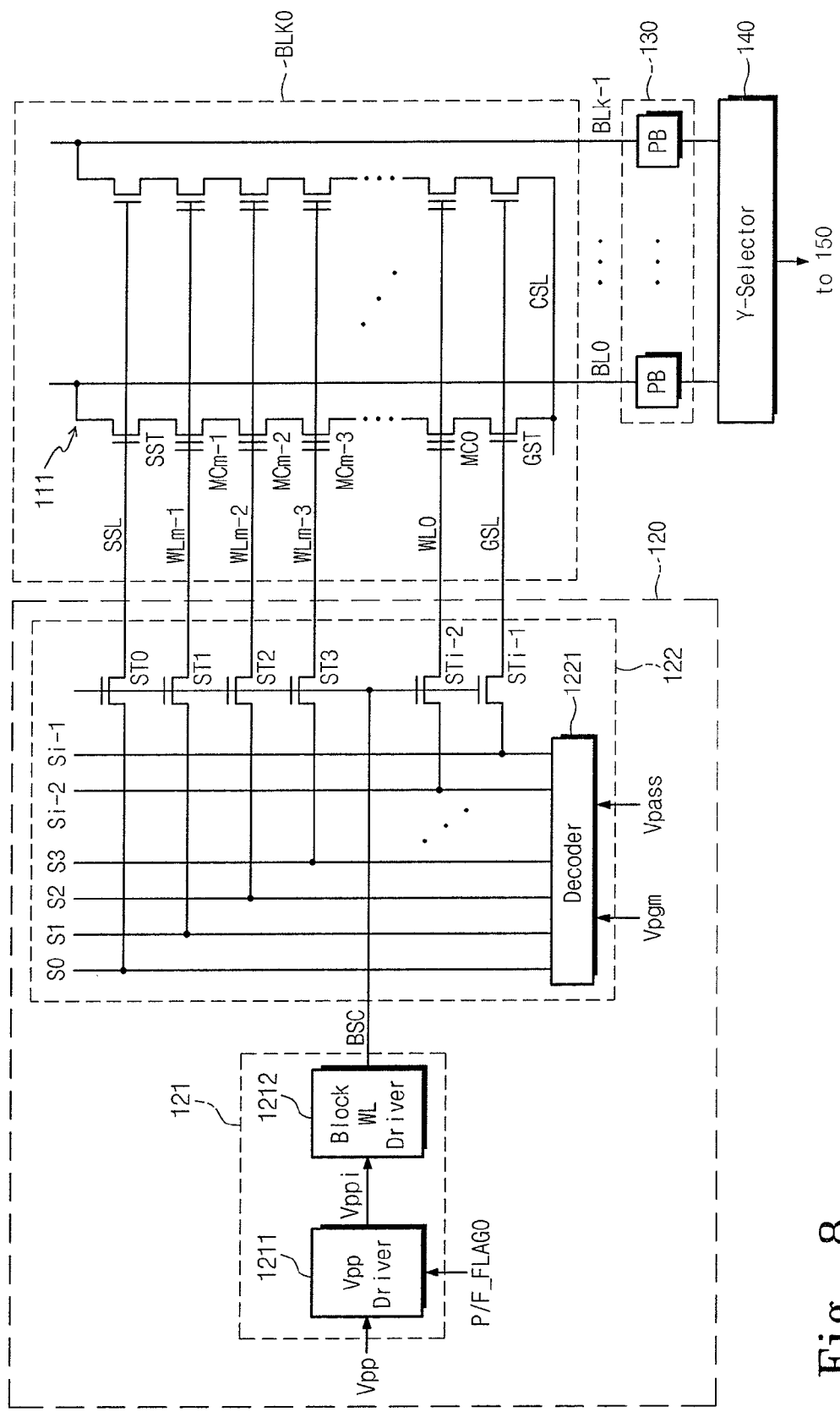
FIG. 8 is a block diagram showing a row selector circuit illustrated in FIG. 3 according to an exemplary embodiment of the present invention.

FIG. 8 is a block diagram showing a row selector circuit 120 illustrated in FIG. 3 according to an exemplary embodiment of the present invention.

The row selector circuit 120 illustrated in FIG. 8 is substantially identical to that in FIG. 6 except that the control signal P/F_FLAG0 is applied to the high-voltage driver 1211 instead of to the block word line driver 1212. For convenience of description, constituent elements that are identical to those in FIG. 6 are marked by the same numerals, and description thereof is thus omitted. The high-voltage driver 1211 may respond to the control signal P/F_FLAG0 from control logic 200 to determine an output of a high voltage Vppi.

Figure 9:
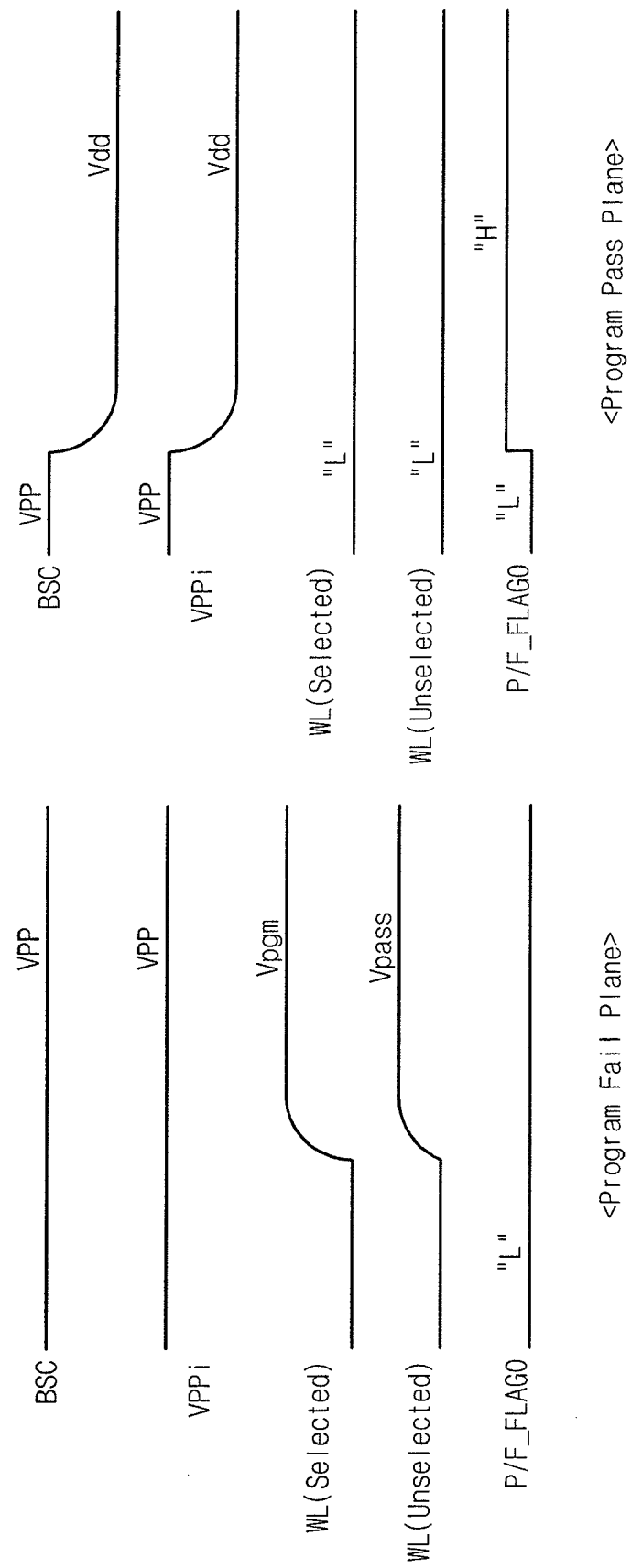
FIG. 9 is a timing diagram for describing a multi-plane program operation of a flash memory device including a row selector circuit illustrated in FIG. 8.

FIG. 9 is a timing diagram for describing a multi-plane program operation of a flash memory device including a row selector circuit illustrated in FIG. 8. Hereinafter, a multi-plane program operation according to the flash memory device will be more fully described with reference to FIGS. 8 and 9.

Basically, a program operation may be performed identically to that described above. After the program operation, a verify operation may be performed. A plane may be judged to be program-passed or program-failed as a verification result.

In the case that the plane is judged to be program-passed, as illustrated in FIG. 9, the control logic 200 shown in FIG. 2 may activate a control signal P/F_FLAG0 in response to a verification result from the program-passed plane 100_0. The activated control signal P/F_FLAG0 may be applied to a high-voltage driver 1211.

The high-voltage driver 1211 may interrupt the high voltage Vpp from the voltage generator circuit 300 shown in FIG. 2 in response to the activated control signal P/F_FLAG0. At this time, the high-voltage driver 1211 may output a predetermined voltage, for example, a voltage identical to or lower than a power supply voltage, as a block word line voltage Vppi. As illustrated in FIG. 9, the predetermined voltage may be applied to a block word line BSC via a block word line driver 1212. Afterwards, an operation will be performed in the same manner as described above. That is, a program operation may be prevented with respect to the program-passed plane.

If a plane is judged to be program-failed, as illustrated in FIG. 9, the control logic 200 may inactivate the control signal P/F_FLAG0 by setting it to a low level in response to a verification result from the program-failed plane. The control logic 200 may apply the inactivated control signal P/F_FLAG0 to the high-voltage driver 1211. As the control signal P/F_FLAG0 is inactivated, the high-voltage driver 1211 may output the high voltage Vpp as the block word line voltage Vppi to the block word line driver 1212. This means that the block word line BSC is driven with the high voltage Vpp being the block word line voltage Vppi. Afterwards, an operation will be performed in the same manner as described above.

As a result, it is possible to prevent the respective program and pass voltages Vpgm and Vpass from being applied to selected memory cells in the program-passed plane. That is, program disturbance may be reduced with respect to the program-passed plane.

Figure 10:
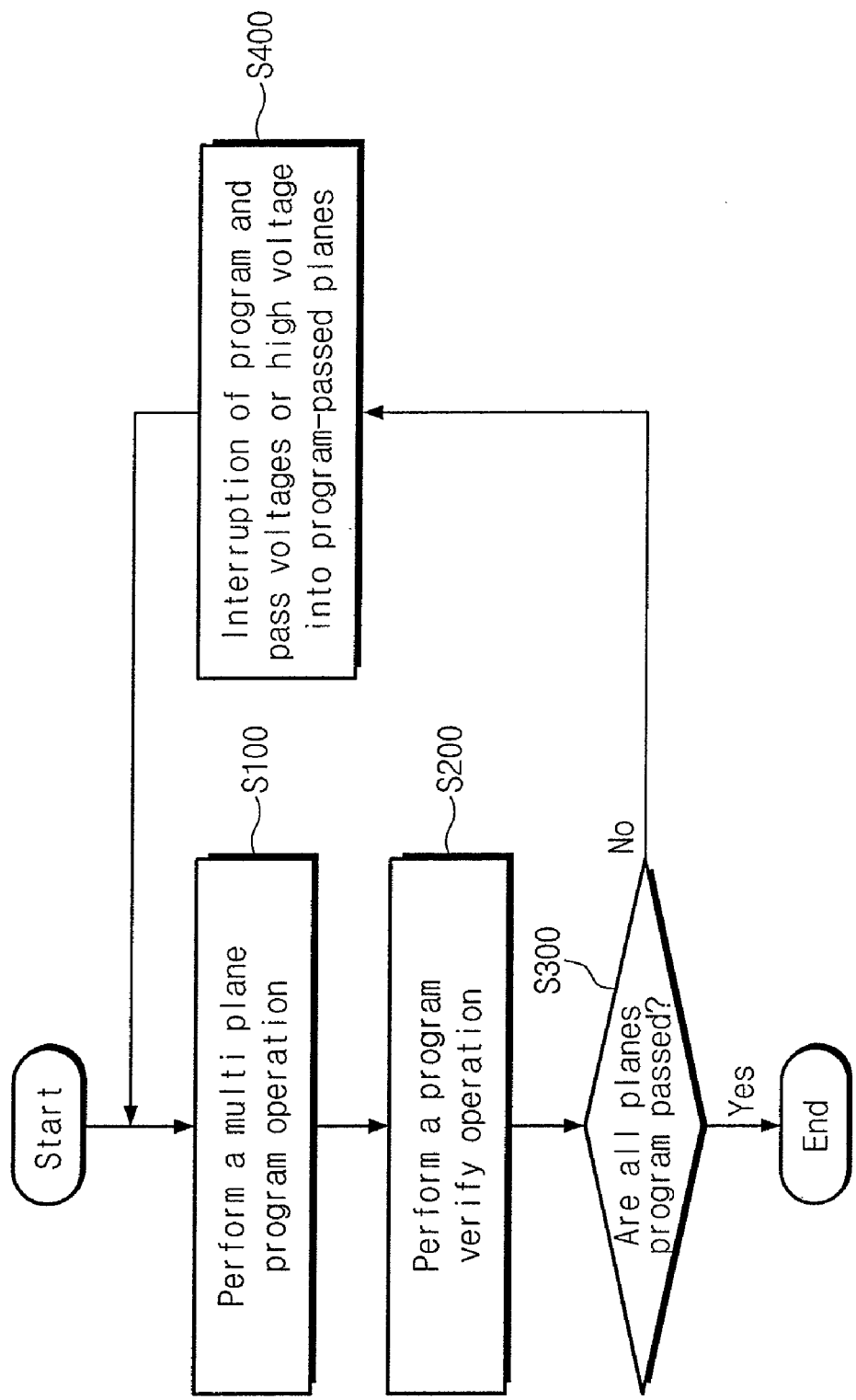
FIG. 10 is a flow diagram for describing a multi-plane program operation of a flash memory device according to an exemplary embodiment of the present invention.

FIG. 10 is a flow diagram for describing a multi-plane program operation of a flash memory device according to an exemplary embodiment of the present invention.

Referring to FIG. 10, a multi-plane program method of a flash memory device according to an exemplary embodiment of the present invention may include performing a multi-plane program operation (S100); performing a program verify operation with respect to all or selected planes (S200); checking whether all or selected planes are program-passed (S300); if at least one plane is judged to be program-failed, repeating the steps S100 to S300 with the program and pass voltages/the high voltage being interrupted with respect to program-passed planes (S400).

The above-disclosed subject matter is to be considered illustrative, and not restrictive, and the appended claims are intended to cover all such modifications, enhancements, and other exemplary embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory device comprising:
a voltage generator circuit configured to generate a program voltage, and a pass voltage;
a plurality of planes configured to perform a program operation in response to the program voltage, and the pass voltage and to verify the program operation; and
a control logic configured to control the plurality of planes in response to program operation verification results from the plurality of planes relating to program-passed planes and program-failed planes,
wherein the control logic controls the plurality of planes to prevent the program and pass voltages from being applied to program passed planes without preventing the program and pass voltages from being applied to program-failed planes, and
wherein each of the plurality of planes comprises:
a memory cell array including a plurality of memory blocks each having memory cells arranged in rows and columns;
a row selector circuit configured to select a memory block and a row of the selected memory block; and
a pass/fail check circuit configured to check whether memory cells in the selected row are programmed normally and to provide a verification result to the control logic,
wherein the row selector circuit is configured to prevent the program voltage and the pass voltage under control of the control logic.

2. The flash memory device of claim 1, wherein the flash memory device is one of an SLC NAND-type flash memory device and an MLC NAND-type flash memory device.

3. The flash memory device of claim 1, wherein the control logic controls row selector circuits of program-passed planes to prevent the program voltage and the pass voltage in response to pass signals from pass/fail check circuits of the program-passed planes.

4. The flash memory device of claim 1, wherein the row selector circuit of a respective plane comprises:
a block decoder configured to select a memory block; and a row decoder configured to select a row of the selected memory block.

5. The flash memory device of claim 4, wherein the control logic controls a row decoder of a program-passed plane to prevent the program voltage and the pass voltage from being applied to memory cells of the program-passed plane.

6. The flash memory device of claim 4, wherein the row decoder of the program-passed plane outputs one of a ground voltage and a predetermined voltage to be supplied to rows of the selected memory cells, the predetermined voltage being a voltage the same as or lower than a power-supply voltage.

7. The flash memory device of claim 4, wherein the block decoder comprises:
a high-voltage driver configured to be supplied with the high-voltage; and
a block word line driver configured to supply the high voltage from the high voltage driver to a row decoder of a corresponding plane so as to be activated.

8. The flash memory device of claim 7, wherein the control logic controls a block word line driver of a program-passed plane to prevent the high voltage from being applied to the block word line driver of the program-passed plane.

9. The flash memory device of claim 8, wherein the block word line driver of the program-passed plane outputs a predetermined voltage that is applied to a row decoder of the program-passed plane.

10. The flash memory device of claim 7, wherein the control logic controls a high-voltage driver of a program-passed plane to interrupt the high voltage.

11. The flash memory device of claim 10, wherein when the high voltage is interrupted, the high-voltage driver generates a predetermined voltage to be supplied to a block word line driver in a corresponding block decoder, the predetermined voltage being a voltage lower than or identical to a power-supply voltage.

12. The flash memory device of claim 11, wherein the block word line driver in the corresponding block decoder provides the received predetermined voltage to a row decoder of a corresponding plane being a program-passed plane.

13. A flash memory device comprising:
a plurality of planes, each configured to store one or more bit per memory cell;
a voltage generator circuit configured to generate a program voltage supplied to the plurality of planes to be programmed during a program operation;
a control logic configured to control the program operation to prevent the program voltage from being applied to a program-passed plane of the plurality of planes; and
the control logic is configured to control the program operation for the plurality of planes to be programmed simultaneously except for the program-passed plane,
wherein the prevention of the program voltage occurs in the control logic and not within the program passed planes, and
wherein each of the plurality of planes comprises a block word line driver configured to select a memory block of a corresponding plane of the plurality of planes by applying a high voltage to a block word line of the selected memory block, wherein the block word line driver is configured to prevent the high voltage from being applied to the block word line of the selected memory block under control of the control logic when the corresponding plane is program-passed.

14. The flash memory device of claim 13, wherein each of the plurality of planes additionally comprises a row selector configured to select word lines of corresponding plane of the plurality of planes by applying the program voltage to the word lines, wherein the row selector circuit is configured to prevent the program voltage from being applied to the word lines under control of the control logic when the corresponding plane is program-passed.

15. A flash memory device comprising:
a plurality of planes, each configured to store one or more bit per memory cell;
a voltage generator circuit configured to generate a program voltage supplied to the plurality of planes to be programmed during a program operation;
a control logic configured to control the program operation to prevent the program voltage from being applied to a program-passed plane of the plurality of planes; and
the control logic is configured to control the program operation for the plurality of planes to be programmed simultaneously except for the program-passed plane,
wherein the prevention of the program voltage occurs in the control logic and not within the program-passed planes, and
wherein each of the plurality of planes comprises:
a block word line driver configured to select a memory block of a corresponding plane of the plurality of planes by applying the high voltage to a block word line of the selected memory block; and
a voltage driver configured to provide the high voltage to the block word line driver,
wherein the voltage driver is configured to prevent the high voltage from being applied to the block word line driver under control of the control logic when the corresponding plane is program-passed.

* * * * *